United States Patent
Muraishi

[11] Patent Number: 5,936,462
[45] Date of Patent: Aug. 10, 1999

[54] AM DEMODULATOR USING LIMITER AMPLIFIER RSSI OUTPUT AS BASEBAND SIGNAL

[75] Inventor: Akihiro Muraishi, Tokyo, Japan

[73] Assignee: Oki Electric Industry Co., Ltd., Tokyo, Japan

[21] Appl. No.: 08/968,113

[22] Filed: Nov. 12, 1997

[30] Foreign Application Priority Data

Feb. 28, 1997 [JP] Japan ..................................... 9-045115

[51] Int. Cl.$^6$ .................................................. H04L 27/06
[52] U.S. Cl. .......................... 329/311; 329/347; 329/369; 375/320; 455/337
[58] Field of Search .................................... 329/311, 347, 329/369; 375/320; 455/337

[56] References Cited

U.S. PATENT DOCUMENTS

| | | | |
|---|---|---|---|
| 5,365,550 | 11/1994 | Roberson | 375/206 |
| 5,455,575 | 10/1995 | Schuermann | 342/42 |
| 5,657,026 | 8/1997 | Culpepper et al. | 342/374 |

FOREIGN PATENT DOCUMENTS

| | | |
|---|---|---|
| 0 331 234 | 9/1989 | European Pat. Off. . |
| 0 692 894 | 1/1996 | European Pat. Off. . |

*Primary Examiner*—Siegfried H. Grimm
*Attorney, Agent, or Firm*—Venable; Robert J. Frank; Catherine A. Ferguson

[57] ABSTRACT

An amplitude-modulated carrier signal is demodulated by passage through a limiting amplifier that converts the amplitude-modulated carrier signal to a signal of constant amplitude, and also produces a received signal strength indicator signal. The received signal strength indicator signal is used as the demodulated signal.

3 Claims, 4 Drawing Sheets

AM DEMODULATOR USING LIMITER AMPLIFIER RSSI OUTPUT AS BASEBAND SIGNAL

BACKGROUND OF THE INVENTION

The present invention relates to a demodulator for demodulating an amplitude-modulated carrier signal, such as a carrier signal modulated by amplitude-shift keying.

Amplitude-shift keying (abbreviated ASK) is a modulation system employed in various wireless systems, including certain digital mobile communication systems. A binary ASK transmitter, for example, transmits a radio-frequency (RF) carrier signal having a large amplitude for one binary value (e.g. '1'), and a small amplitude for the other binary value (e.g. '0'). Alternatively, the carrier signal is transmitted for one value and not transmitted for the other value.

A receiver equipped with a conventional ASK demodulator receives the RF carrier signal, down-converts the received signal to an intermediate frequency (IF), performs automatic gain control (AGC), then detects the envelope of the IF signal to produce a baseband signal, and decides from the amplitude of the baseband signal whether each transmitted bit of information is a one or a zero.

The high speed of recent digital communication systems, however, requires an AGC loop with fast tracking capability, in order to maintain the proper levels in the baseband signal. This, in turn, requires complex and expensive AGC circuitry.

Moreover, mobile systems in particular often transmit data in bursts. If the time constant of the AGC loop is set long enough to maintain steady '1' and '2' levels, there is a period at the beginning of each burst in which the AGC loop is unsettled and data errors become likely. If the time constant of the AGC loop is shortened to avoid this situation, the danger exists that the AGC loop will oscillate in response to a pattern of 1s and 0s.

SUMMARY OF THE INVENTION

It is accordingly an object of the present invention to provide a low-cost demodulator for an amplitude-modulated signal.

Another object of the invention is to avoid data errors at the beginnings of communication bursts.

The invented demodulator receives an amplitude-modulated RF or IF carrier signal. The demodulator comprises a limiting amplifier that limits the amplitude of the carrier signal to produce an output signal with a constant amplitude, and also produces a received signal strength indicator signal. The received signal strength indicator signal is used as a baseband signal from which the information represented by the modulated amplitude is recovered.

The invented demodulator is low in cost because it has no AGC loop, and also avoids the data errors that were caused by AGC loop instability at the beginning of communication bursts in conventional demodulators.

DETAILED DESCRIPTION OF THE INVENTION

Embodiments of the invention will be described with reference to the attached illustrative drawings.

Figure 1:
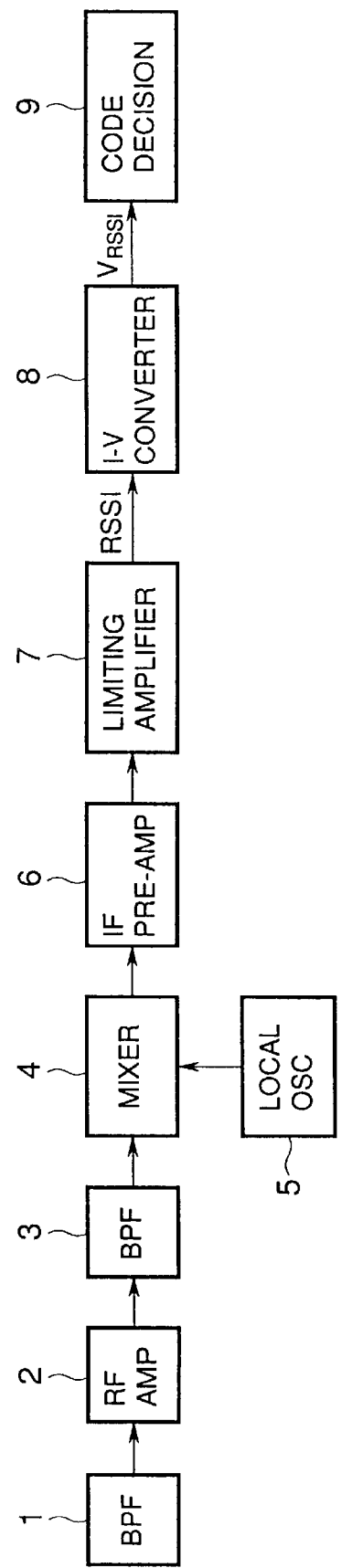
FIG. 1 is a block diagram of an ASK receiver embodying the invented demodulator.

FIG. 1 is a block diagram of an ASK receiver having a demodulator or the invented type. The receiver receives an ASK signal in, for example, the 5.8-gigahertz band from an antenna (not shown). The receiver comprises a bandpass filter (BPF) 1 that rejects unwanted frequency components outside this band, an RF, amplifier (AMP) 2 that amplifies the filtered signal, another bandpass filter 3 that again rejects unwanted frequencies, and a mixer 4 that mixes (multiplies) the resulting signal with a signal generated by a local oscillator (OSC) 5, thereby down-converting the signal to an intermediate frequency band such as the 70-megahertz band. The down-converted carrier signal is pre-amplified by an IF pre-amplifier 6, then fed into a limiting amplifier 7.

The conventional function of a limiting amplifier is to convert an input carrier signal to an output carrier signal of constant amplitude. Limiting amplifiers are commonly employed in receivers for frequency-modulated (FM) signals, and signals modulated by frequency-shift keying (FSK), to simplify frequency detection. A limiting amplifier generally operates by employing the saturation characteristic of an active element such as a transistor.

Some commercially available limiting amplifiers produce both a constant-amplitude output signal and a received signal strength indicator signal, or RSSI signal. If the limiting amplifier operates by amplifying the input signal until the output signal saturates, the RSSI signal can be derived as a current signal responsive to the gain at the saturation point. The limiting amplifier 7 employed in the present embodiment is of this type.

The RSSI signal is conventionally used to control the gain of another amplifier. In certain hand-held information terminals, for example, the RSSI signal (or a signal obtained by smoothing the RSSI signal) is used to control the gain of a transmitting power amplifier. The RSSI signal may also be used to control the gain of another amplifier in the receiving circuits.

The usage of the limiting amplifier 7 in the present invention differs from the conventional usage. The constant-amplitude carrier signal produced by the limiting amplifier 7 is not used at all; the output lead for this signal may be left unconnected, or grounded. The RSSI signal is used, not for amplifier gain control, but to obtain the information carried by the received signal.

Since the RSSI signal is a current signal, it is fed to a current-to-voltage (I–V) converter 8 and converted to a voltage signal, referred to below as the voltage RSSI signal ($V_{RSSI}$) or baseband signal.

The mixer 4, IF pre-amplifier 6, limiting amplifier 7, and I–V converter 8 can be combined into a single integrated circuit. Integrated circuits of this type are available from several manufacturers, for use in FM and FSK systems. One example is the SA626 integrated circuit manufactured by the Philips Corporation in The Netherlands.

The voltage RSSI signal output by the I–V converter 8 is fed to a code decision circuit 9. This circuit can be configured in various ways: three examples will be described next.

Figure 2:
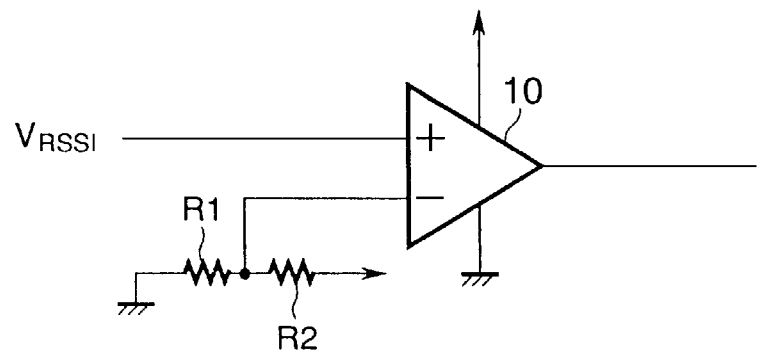
FIG. 2 shows one example of the structure of the code decision circuit in FIG. 1.

Referring to FIG. 2, in one example, the code decision circuit 9 comprises an analog comparator 10 and a pair of resistors R1 and R2. Resistors R1 and R2 are coupled in series as a voltage divider between a power-supply terminal and a ground terminal, and produce a threshold voltage which is supplied to the inverting input terminal of the analog comparator 10. The voltage RSSI signal ($V_{RSSI}$) is supplied to the non-inverting input terminal of the analog comparator 10. The analog comparator 10 produces a high or low logic-level output signal depending on whether $V_{RSSI}$ is greater than or less than the threshold voltage.

Figure 3:
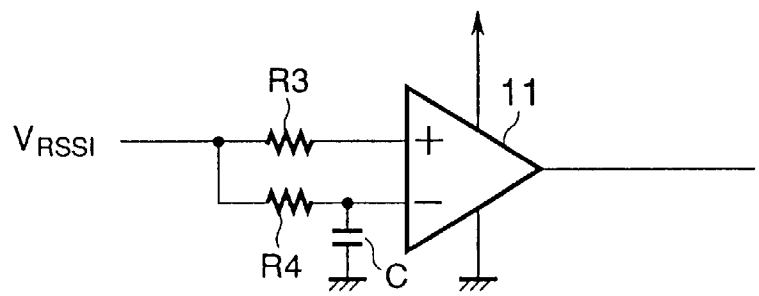
FIG. 3 shows another example of the structure of the code decision circuit in FIG. 1.

Referring to FIG. 3, in another example, the code decision circuit 9 comprises an analog comparator 11, a pair of resistors R3 and R4, and a capacitor C. The voltage RSSI signal is coupled through resistor R3 to the non-inverting input terminal of the analog comparator 11, and through resistor R4 to the inverting input terminal of the analog comparator 11. One terminal of the capacitor C is coupled to a point between resistor R4 and the inverting input terminal of the analog comparator 11. The other terminal of the capacitor C is coupled to ground. Resistor R4 and capacitor C form an integrating circuit that smoothes the voltage RSSI signal, the smoothed voltage providing a threshold signal with which the voltage RSSI signal is compared.

Figure 4:
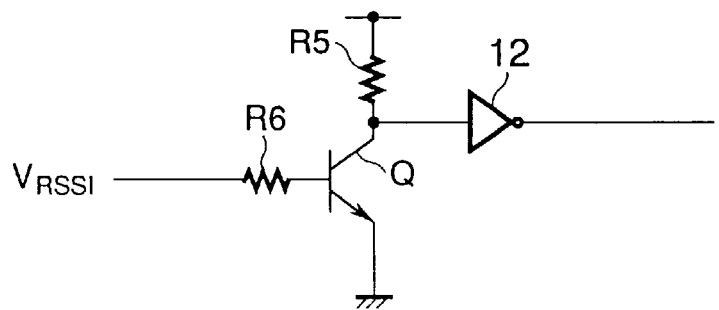
FIG. 4 shows yet another example of the structure of the code decision circuit in FIG. 1.

Referring to FIG. 4, in yet another example, the code decision circuit 9 comprises an npn transistor Q, a load resistor R5, a base resistor R6, and an inverter 12. The emitter of transistor Q is coupled to ground. The collector of transistor Q is coupled to the input of inverter 12, and through load resistor R5 to a power-supply terminal. $V_{RSSI}$ is coupled through base resistor R6 to the base of transistor Q. The output of inverter 12 is high or low depending on whether $V_{RSSI}$ is greater than or less than the cut-in voltage of transistor Q, the cut-in voltage being a voltage in the range from about 0.6 volt to about 0.7 volt.

Next, the operation of the invented demodulator will be described.

Figure 5:
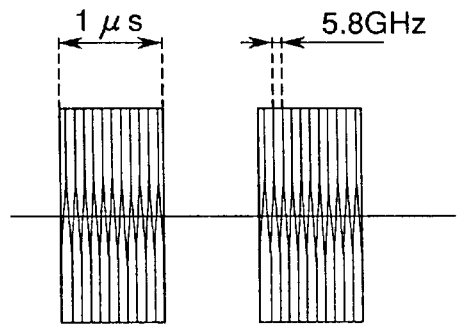
FIG. 5 shows a received signal with a 100% modulation factor.

The amplitude of the RF signal received from the antenna takes on two values A and B, corresponding to bit values of '1' and '0.' The modulation factor is defined by (A–B)/(A+B). FIG. 5 shows an idealized example in which the carrier frequency is 5.8 gigahertz (GHz), the modulation factor is 100%, and the data rate is one bit per microsecond ($\mu$s), or one megabit per second.

The IF carrier signal output by the IF pre-amplifier 6 differs in frequency and amplitude from the received RF carrier signal, but has the same type of envelope. The RSSI signal produced by the limiting amplifier 7 is related in a substantially linear manner to the upper envelope (or lower envelope) of the IF carrier signal, or to a moving average of this envelope level. The $V_{RSSI}$ signal produced by the I–V converter 8 is accordingly similar to a signal that would be produced by envelope detection of the received RF signal, or the IF signal.

Figure 6:
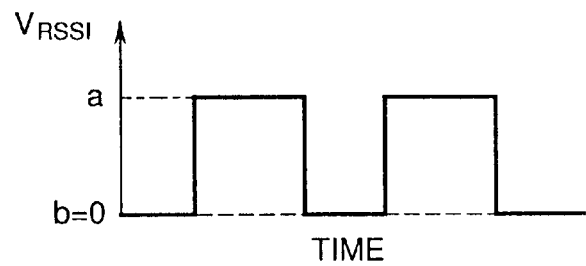
FIG. 6 shows the corresponding received signal strength indicator signal.

For the idealized example indicated in FIG. 5, $V_{RSSI}$ takes on two values (a and b) as shown in FIG. 6. The vertical axis in FIG. 6 represents voltage, while the horizontal axis represents time.

Figure 7:
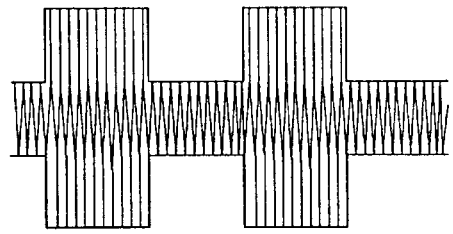
FIG. 7 shows a received signal with a 50% modulation factor.
Figure 8:
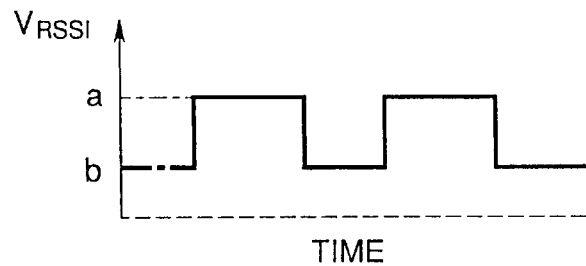
FIG. 8 shows the corresponding received signal strength indicator signal.

FIG. 7 shows another example of a received signal waveform, in which the modulation factor of the received signal is only 50%. FIG. 8 shows the corresponding $V_{RSSI}$ waveform, which again takes on two voltage values (a and b). The vertical and horizontal axes in FIG. 8 have the same meaning as in FIG. 6.

The two voltage values (a and b) of the $V_{RSSI}$ signal should be symmetrically disposed on opposite sides of the threshold voltage of the code decision circuit 9. In the circuit configuration shown in FIG. 2, this is achieved by selecting resistors R1 and R2 that produce a threshold voltage substantially equal to (a+b)/2. In FIG. 3, this is achieved by selecting the time constant of the integrating circuit comprising resistor R4 and capacitor C so that in the presence of an input signal like that in FIG. 5 or FIG. 7, the threshold voltage is again substantially equal to (a+b)/2. In FIG. 4, this is achieved by selecting a limiting amplifier 7 with characteristics such that the two $V_{RSSI}$ values (a and b) are symmetrically disposed on opposite sides of the cut-in voltage of transistor Q.

These selections of resistor and capacitor values, or limiting amplifier characteristics, can be made without concern for the frequency of the received signal, because if this frequency changes, due to motion of the receiver, for example, the RSSI signal is scarcely affected. It was this observation that led to the present invention.

Given appropriate selection of these characteristics or values, for the received signal in either FIG. 5 or 7, the output of the code decision circuit 9 will be a string of bits with values '0 1 0 1 0 . . . '

The invented demodulator comprises the mixer 4, IF pre-amplifier 6, limiting amplifier 7, I–V converter 8, and code decision circuit 9 in FIG. 1. As noted above, the mixer 4, IF pre-amplifier 6, limiting amplifier 7, and I–V converter 8 are available in a single integrated circuit, but if necessary, the I–V converter 8 can be provided separately; a simple circuit comprising a resistor suffices. The code decision circuit 9 can be configured from a few simple, inexpensive electronic components, as shown in FIGS. 2 to 4.

Figure 9:
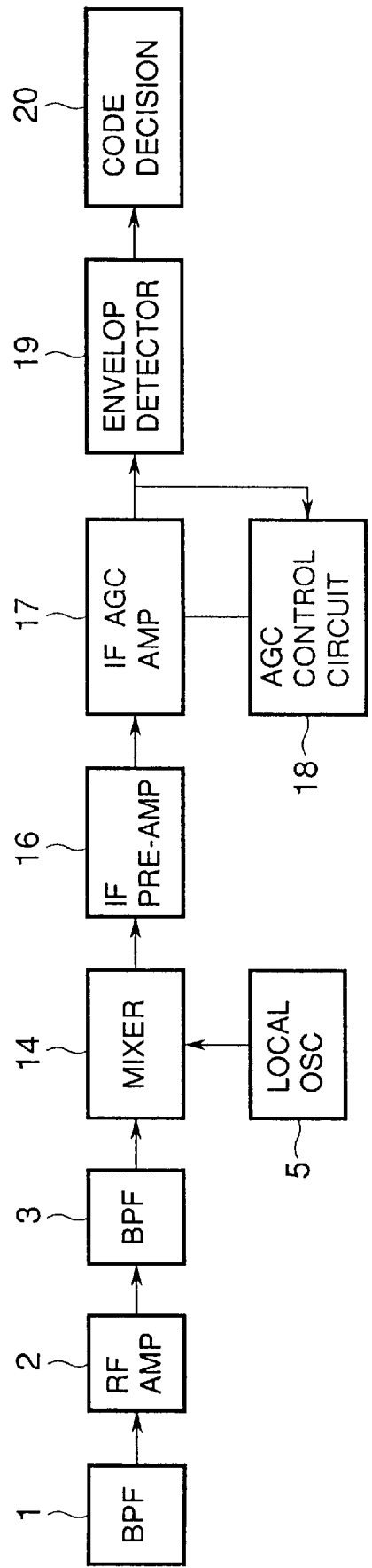
FIG. 9 is a block diagram of an ASK receiver embodying a conventional demodulator.

For comparison, FIG. 9 shows a receiver employing a conventional demodulator circuit. The bandpass filter 1, RF amplifier 2, bandpass filter 3, and local oscillator 5 are similar to the corresponding elements in FIG. 1. The mixer 14 and IF pre-amplifier 16 are also similar to the corresponding elements in FIG. 1, although not necessarily combined into the same integrated circuit. The signal output by the IF pre-amplifier 16 is amplified by an IF AGC amplifier 17, then fed to an AGC control circuit 18 and envelope detector 19. The AGC control circuit controls the gain of the AGC amplifier 17. The output of the envelope detector 19 is fed to a code decision circuit 20.

As noted earlier, an AGC control circuit 18 capable of coping with high-speed ASK transmissions is complex and expensive, and the existence of an AGC loop between the IF pre-amplifier 16 and envelope detector 19 is a potential source of problems related to the AGC time constant. These problems are eliminated in the invented demodulator, which has no AGC loop. For the same reason, the invented demodulator is lower in cost.

The invented demodulator is particularly advantageous in receiving high-speed burst transmissions. The absence of an AGC circuit enables accurate code decisions to be made even at the beginning of a burst.

In FIG. 1, the received signal was down-converted once before being input to the limiting amplifier 7, but this is not a restriction. The received signal may be down-converted more than once, for example, or the received signal may be fed directly to the limiting amplifier 7, without down-conversion.

The demodulation of a binary ASK signal was described above, but the invented demodulator can also be used for M-ary ASK, where M is an integer greater than two. The invented demodulator can also be applied to the demodulation of general analog amplitude-modulated (AM) signals.

The invented demodulator is not limited to use in wireless communication systems; it can be employed in wireline systems as well. In optical communications, for example, an intensity-modulated lightwave signal is converted by a photodetector to an electrical signal of the binary (or M-ary) ASK type. The invented demodulator can be used to demodulate this electrical signal.

Those skilled in the art will recognize that further variations are possible within the scope claimed below.

What is claimed is:

1. A demodulator for demodulating an amplitude-modulated carrier signal, said amplitude-modulated carrier signal being modulated by amplitude-shift keying, to obtain a baseband signal, comprising:
    a limiting amplifier for receiving said amplitude-modulated carrier signal as an input signal, converting said amplitude-modulated carrier signal to a signal of constant amplitude and producing a received signal strength signal indicator signal responsive to an amplitude of said amplitude-modulated carrier signal, said received signal strength indicator signal being used as the baseband signal; and
    a code decision circuit for detecting, from said received signal strength indicator signal, bit values of said amplitude-modulated carrier signal, said code decision circuit comprising:
        a pair of resistors coupled in series, for dividing a power supply voltage to produce a threshold voltage; and
        an analog comparator for comparing said received signal strength indicator signal with said threshold voltage.

2. A demodulator for demodulating an amplitude-modulated carrier signal, said amplitude-modulated carrier signal being modulated by amplitude-shift keying, to obtain a baseband signal, comprising:
    a limiting amplifier for receiving said amplitude-modulated carrier signal as an input signal, converting said amplitude-modulated carrier signal to a signal of constant amplitude and producing a received signal strength signal indicator signal responsive to an amplitude of said amplitude-modulated carrier signal, said received signal strength indicator signal being used as the baseband signal, a code decision circuit for detecting, from said received signal strength indicator signal, bit values of said amplitude-modulated carrier signal, said code decision circuit comprising:
    an analog comparator having a first input terminal and a second input terminal;
    a first resistor coupled to said first input terminal, said received signal strength indicator signal being supplied through said first resistor to said first input terminal;
    a second resistor coupled to said second input terminal, said received signal strength indicator signal being supplied through said second resistor to said second input terminal; and
    a capacitor coupled between said second input terminal and a fixed potential, for smoothing said received signal strength indicator signal to produce a threshold voltage with which said analog comparator compares said received signal strength indicator signal.

3. A demodulator for demodulating an amplitude-modulated carrier signal, said amplitude-modulated carrier signal being modulated by amplitude-shift keying, to obtain a baseband signal, comprising;
    a limiting amplifier for receiving said amplitude-modulated carrier signal as an input signal, converting said amplitude-modulated carrier signal to a signal of constant amplitude and producing a received signal strength signal indicator signal responsive to an amplitude of said amplitude-modulated carrier signal, said received signal strength indicator signal being used as the baseband signal, and
    a code decision circuit for detecting, from said received signal strength indicator signal, bit values of said amplitude-modulated carrier signal, said code decision circuit comprising:
        a bipolar transistor having an emitter, a collector, and a base, said emitter being coupled to a first fixed potential;
        a load resistor coupled between said collector and a second fixed potential;
        a base resistor coupled to said base, said received signal strength indicator signal being supplied through said base resistor to said base; and an inverter coupled to said collector.

* * * * *